United States Patent
Gill et al.

(10) Patent No.: US 7,467,459 B2
(45) Date of Patent: Dec. 23, 2008

(54) METHOD FOR MANUFACTURING A CURRENT IN PLANE MAGNETORESISTIVE SENSOR HAVING A CONTIGUOUS HARD BIAS LAYER LOCATED AT BACK EDGE OF STRIPE HEIGHT

(75) Inventors: Hardayal Singh Gill, Palo Alto, CA (US); Kuok San Ho, Santa Clara, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 474 days.

(21) Appl. No.: 11/108,427

(22) Filed: Apr. 18, 2005

(65) Prior Publication Data

US 2006/0230601 A1 Oct. 19, 2006

(51) Int. Cl.
*G11B 5/127* (2006.01)
*H04R 31/00* (2006.01)

(52) U.S. Cl. ............... 29/603.07; 29/603.14; 29/603.15; 29/603.16; 360/324.12

(58) Field of Classification Search .............. 29/603.07, 29/603.16, 603.18, 603.27, 604, 603.12, 29/603.13, 603.14, 603.15; 360/324.12; 216/22, 41
See application file for complete search history.

(56) References Cited

U.S. PATENT DOCUMENTS

| | | | |
|---|---|---|---|
| 5,883,764 A * | 3/1999 | Pinarbasi ................... 360/322 |
| 6,018,443 A * | 1/2000 | Watanabe et al. ........... 360/319 |
| 6,085,406 A * | 7/2000 | Garfunkel et al. ......... 29/603.14 |
| 6,223,420 B1 | 5/2001 | Lee et al. ................. 29/603.14 |
| 6,262,869 B1 * | 7/2001 | Lin et al. ................ 360/324.11 |
| 6,756,135 B2 | 6/2004 | Hasegawa et al. ........... 428/692 |
| 6,831,816 B2 | 12/2004 | Gill ........................ 360/324.12 |
| 2002/0154456 A1 | 10/2002 | Carey et al. ............ 360/324.11 |
| 2003/0048585 A1 | 3/2003 | Gill ........................ 360/324.12 |
| 2003/0227725 A1 | 12/2003 | Macken et al. ......... 360/324.12 |
| 2004/0075959 A1 | 4/2004 | Gill ........................ 360/324.12 |
| 2004/0257716 A1 | 12/2004 | Heim et al. .............. 360/324.1 |

FOREIGN PATENT DOCUMENTS

JP 11328622 A * 11/1999

* cited by examiner

*Primary Examiner*—A. Dexter Tugbang
*Assistant Examiner*—Livius R Cazan
(74) *Attorney, Agent, or Firm*—Zilka-Kotab, PC

(57) ABSTRACT

A current in plane giant magnetoresistive (GMR) sensor having a hard bias layer that extends along the back edge (strip height) of the sensor rather than from the sides of the sensor. The hard bias layer preferably extends beyond the track width of the sensor. Electrically conductive leads, which may be a highly conductive material such as Cu, Rh or Au, or may be an electrically conductive magnetic material extend from the sides of the sensor stack. The bias layer is separated from the sensor stack and from the leads by thin layer of electrically conductive material, thereby preventing current shunting through the hard bias layer.

7 Claims, 13 Drawing Sheets

METHOD FOR MANUFACTURING A CURRENT IN PLANE MAGNETORESISTIVE SENSOR HAVING A CONTIGUOUS HARD BIAS LAYER LOCATED AT BACK EDGE OF STRIPE HEIGHT

The present invention is related to U.S. patent application entitled A CURRENT IN PLANE MAGNETORESISTIVE SENSOR HAVING A CONTIGUOUS HARD BIAS LAYER LOCATED AT BACK EDGE OF STRIPE HEIGHT, having application Ser. No. 11/108,629, filed on Apr. 18, 2005 to common inventors.

FIELD OF THE INVENTION

The present invention relates to magnetoresistive sensors and more particularly to a current in plane magnetoresistive sensor having an electrically insulating hard magnetic bias layer formed at the back edge of the sensor opposite the air bearing surface (ABS).

BACKGROUND OF THE INVENTION

The heart of a computer's long term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to $\cos \theta$, where $\theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

When a spin valve sensor employs a single pinned layer it is referred to as a simple spin valve. When a spin valve employs an antiparallel (AP) pinned layer it is referred to as an AP pinned spin valve. An AP spin valve includes first and second magnetic layers separated by a thin non-magnetic coupling layer such as Ru. The thickness of the spacer layer is chosen so as to antiparallel couple the magnetizations of the ferromagnetic layers of the pinned layer. A spin valve is also known as a top or bottom spin valve depending upon whether the pinning layer is at the top (formed after the free layer) or at the bottom (before the free layer).

The spin valve sensor is located between first and second nonmagnetic electrically insulating read gap layers and the first and second read gap layers are located between ferromagnetic first and second shield layers. In a merged magnetic head a single ferromagnetic layer functions as the second shield layer of the read head and as the first pole piece layer of the write head. In a piggyback head the second shield layer and the first pole piece layer are separate layers.

Magnetization of the pinned layer is usually fixed by exchange coupling one of the ferromagnetic layers (AP1) with a layer of antiferromagnetic material such as PtMn. While an antiferromagnetic (AFM) material such as PtMn does not in and of itself have a magnetization, when exchange coupled with a magnetic material, it can strongly pin the magnetization of the ferromagnetic layer.

The push for ever increased data rate and data capacity results in a need for GMR sensors having ever increased performance. One measure of such performance (dR/R) is the change in resistance in response to a magnetic field (dR) divided by the nominal resistance, or "sheet resistance" (R). Parasitic resistance, such as from poorly conducing leads, contributes to the sheet resistance, thereby lowering the dR/R performance.

Another factor affecting performance in is free layer sensitivity. The free layer should be able to respond as freely as possible to the presence to a magnetic field, especially at the ABS of the sensor where the field is primarily detected. That is to say that the free layer's magnetic moment must be easily rotated in response to a magnetic field. This free layer sensitivity has been limited, however, by the competing need for free layer stability. The moment of the free layer must remain biased, even in the event of a high temperature event such as a head disk contact or an electrostatic discharge (ESD). As heads become ever smaller, the ability of traditional hard bias layer structures to maintain stable free layer biasing decreases. This is due in part to the reduced junction area at the sides of the sensor at which the hard bias layer provides it's biasing magnetic field.

Therefore, there is a strong felt need for a structure that can provide free layer biasing that is both stable in a very small sensor and also provides optimal free layer sensitivity at the ABS of the sensor, where the magnetic field from the medium is primarily detected. There is also a strong felt need for a structure that can reduce parasitic resistance from the electrical leads, thereby increasing dR/R performance.

SUMMARY OF THE INVENTION

The present invention provides method for constructing a current in plane (CIP) magnetoresistive sensor for use in magnetic recording that has a hard bias layer disposed at the back edge (stripe height) of the sensor. The method includes depositing a plurality of sensor layers. A photolithographic process and material removal process are then performed to define the track width of the sensor. Electrically conducive lead material can the be deposited at the sides of the sensor. The back edge or strip height of the sensor can then be defined by another photolithographic and material removal process. A hard bias insulation layer and a layer of hard magnetic biasing material can then be deposited to form a hard bias structure at the back edge of the sensor.

The sensor may include a sensor stack having sides that define a track width and has a back edge opposite the air bearing surface (ABS). The sensor stack may be sandwiched between first and second non-magnetic, electrically insulating gap layers, having leads that extend from the sides of the sensor stack that essentially fill the space between the first and second gap layers. The hard bias layer is formed at the back edge of the sensor stack and is separated from the sensor stack and from the leads by an electrically insulating layer.

The hard bias layer may have a width that is larger than the track width of the sensor and may extend beyond the sides of the sensor stack. The leads may be constructed of a very highly conductive material, such as Cu, Rh, Au or some other material. Alternatively, the leads may be constructed of a material that is both electrically conductive and magnetic with a high permeability. In this way the leads can serve as side shields.

The sensor can be constructed by a method that reverses the K3 and K5 processes to perform the K5 process before the K3 process. In other words, the sensor can be constructed by first performing a masking and ion milling procedure to define the track width of the sensor, and then performing a second masking and ion milling process to define the back edge (stripe height) of the sensor. When defining the back edge of the sensor, the mask used to define the back edge can have an opening that not only extends along the back edge of the sensor but also extends slightly beyond the sides of the sensor. A thin layer of insulating material such as conformally deposited alumina can then be deposited, followed by a hard magnetic material such as CoPtCr.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

BEST MODE FOR CARRYING OUT THE INVENTION

The following description is of the best embodiments presently contemplated for carrying out this invention. This description is made for the purpose of illustrating the general principles of this invention and is not meant to limit the inventive concepts claimed herein.

Figure 1:
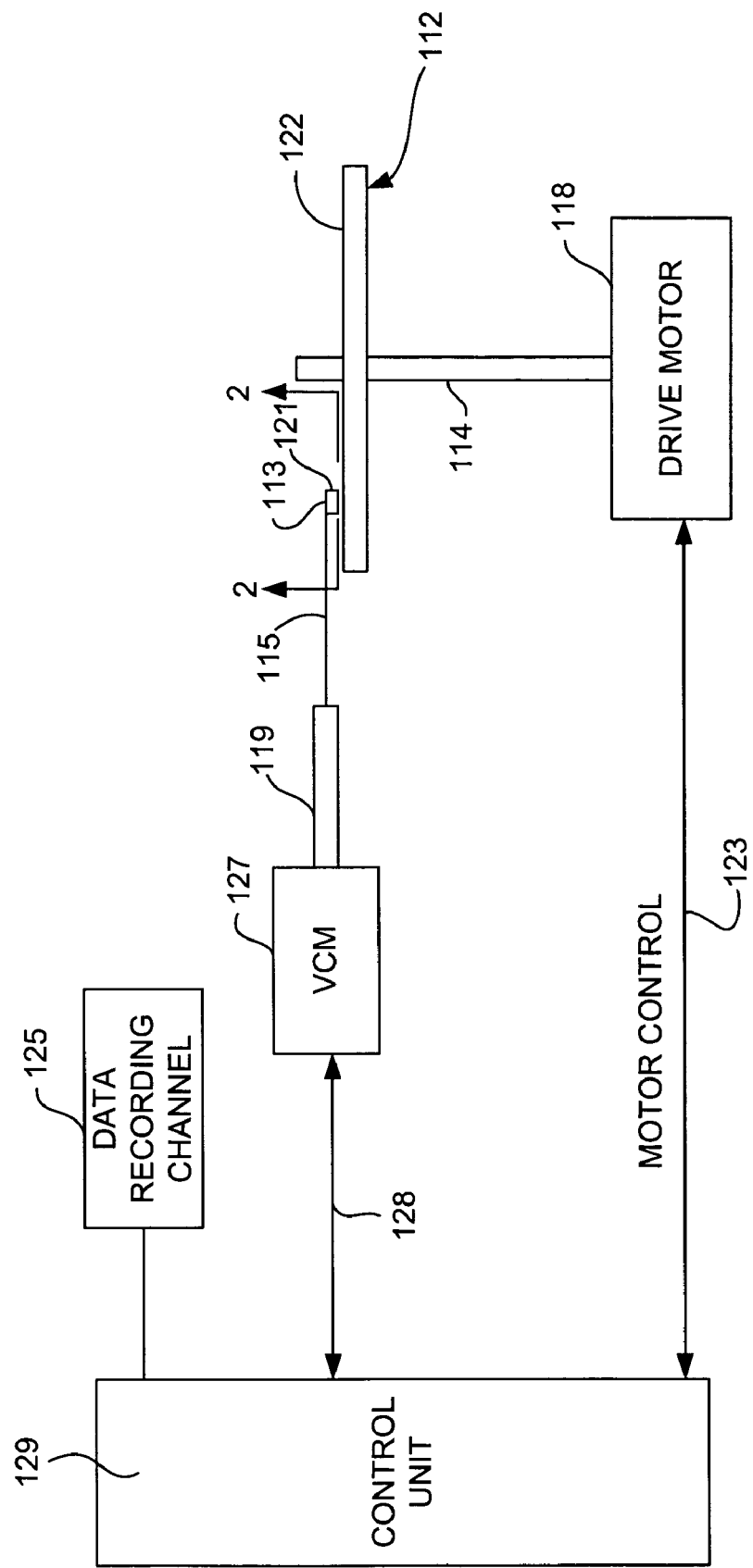
FIG. 1 is a schematic illustration of a disk drive system in which the invention might be embodied.

Referring now to FIG. 1, there is shown a disk drive 100 embodying this invention. As shown in FIG.1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
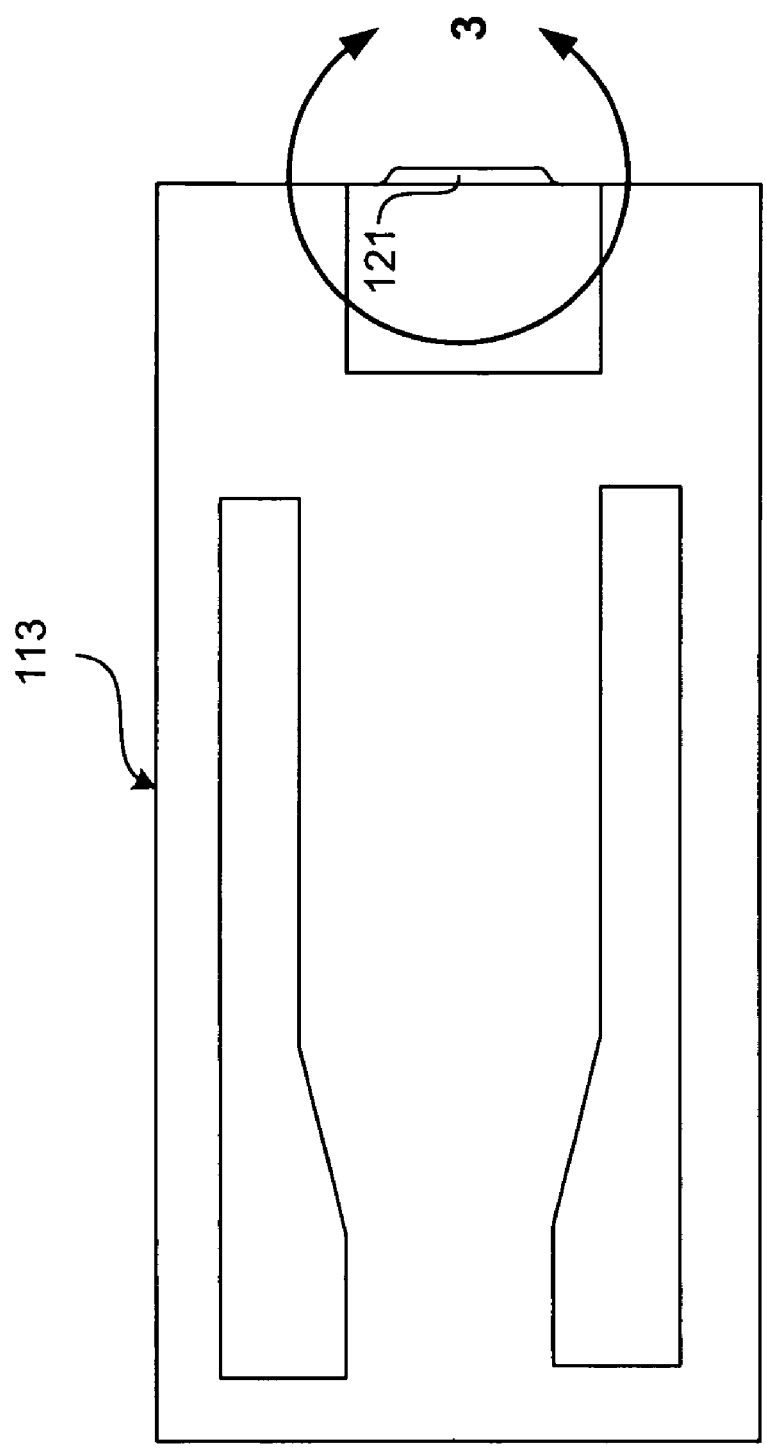
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
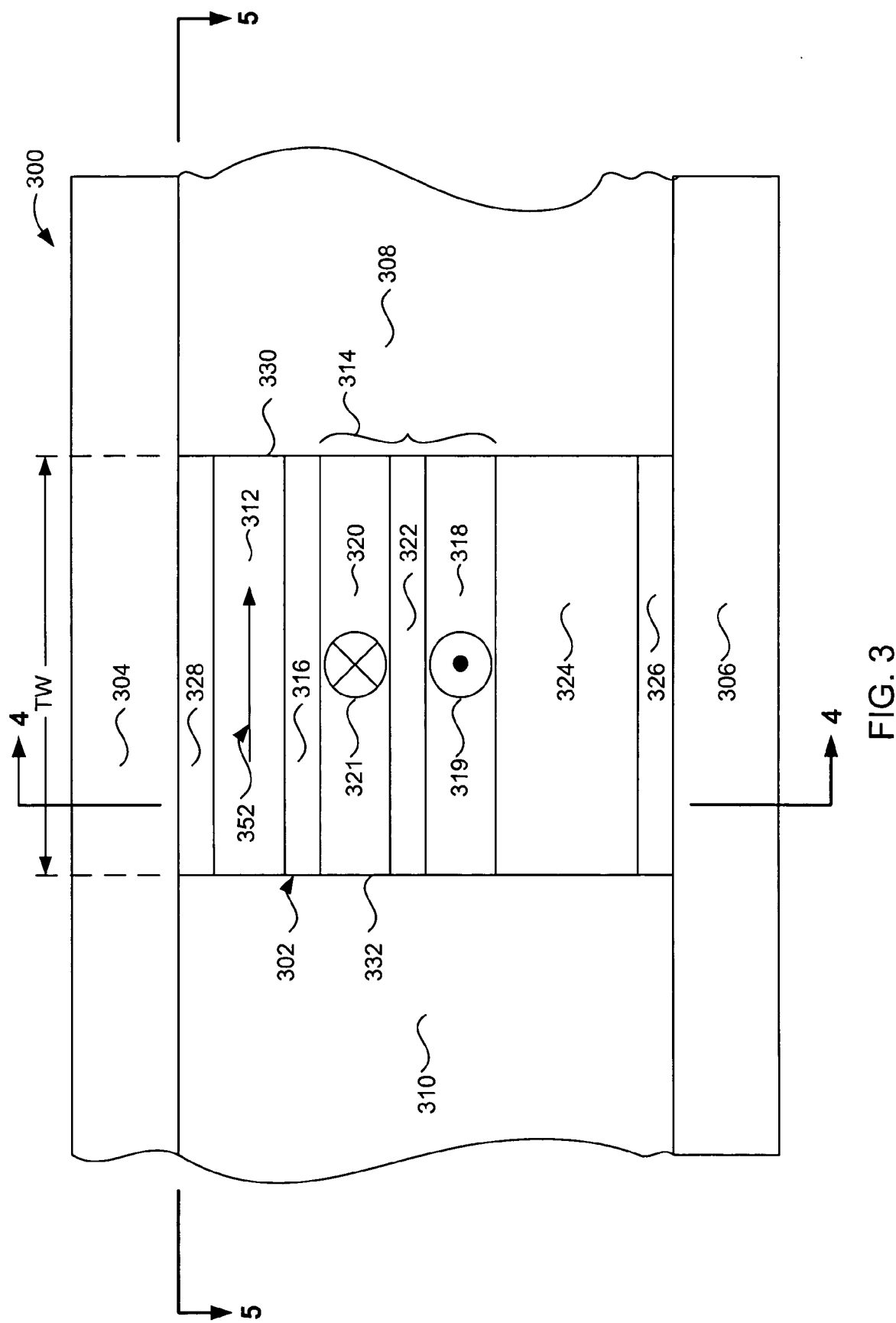
FIG. 3; is an ABS view, taken from circle 3 of FIG. 2 illustrating a sensor according to an embodiment of the invention.

With reference now to FIG. 3, a magnetoresistive sensor 300 according to an embodiment of the invention includes a magnetoresistive sensor element or sensor stack 302, sandwiched between first and second non-magnetic, electrically insulating gap layers 304, 306, which can be constructed of, for example alumina ($Al_2O_3$). First and second electrically conductive lead layers 308, 310 extend laterally from the sides of the sensor stack 302 between the first and second gap layers 304, 306.

The sensor stack 302 includes a magnetic free layer 312, a pinned layer structure 314 and a non-magnetic, electrically conductive spacer layer 316, constructed of, for example Cu. The free layer can be constructed of several magnetic materials such as Co or CoFe, or of a combination of layers of different magnetic materials.

The pinned layer structure 314 may be a simple pinned structure or an antiparallel pined (AP pinned) structure, and may be either self pinned or AFM pinned. For purposes of clarity, the pinned layer structure 314, is described as an AP pinned layer structure having first and second ferromagnetic layers 318, 320, which are antiparallel coupled across a non-magnetic, electrically conductive AP coupling layer 322 such as Ru. The first and second magnetic layers 318, 320 can be constructed of, for example CoFe, NiFe or some combination of these or other materials. A layer of antiferromagnetic material (AFM layer) 324 is disposed beneath the pinned layer structure 314, and can be for example PtMn, IrMn or some other antiferromagnetic material. The AFM layer 324 is exchange coupled with the first magnetic layer 318 and strongly pins the magnetic moments of the magnetic layers as indicated by symbols 319, 321.

The sensor stack 302 also may include a seed layer 326 formed at the bottom of the sensor stack 302, which can be used to initiate a desired crystalline growth in the layers of the sensor stack 302. A capping layer 328, such as for example Ta or some other suitable material may be provided at the top of the sensor stack 302 to protect the layers of the sensor stack from damage during manufacturing processes such as annealing. The sensor stack 302 has first and second lateral sides 330, 332 that define the track width (TW) of the sensor.

The leads 308, 310 are constructed of an electrically conductive material such as Cu, Au, Rh or some other suitable electrically conductive material. As can be seen, the leads can extend from one gap 306 to the other gap 304, which allows the leads 308,310 to be much thicker than prior art designs. This a great advantage over prior art designs wherein the majority of the space between the gap layers was hard bias material and only a small portion of the area was lead material. Hard bias materials have an electrical resistivity of about 50-60 μOhmcm, whereas the much more conductive lead material has a resistivity of only about 5-6 μOhmcm. Therefore the ability to fill essentially the entire area between the gap layers 304, 306 with the much more highly conductive lead material advantageously results in a very highly conductive lead, thereby reducing parasitic resistance.

In one embodiment of the invention, the leads 308, 310 can be constructed of a soft (high permeability) magnetic material such as NiFe or CoFe so that they can serve as side shields as well as leads. Although such magnetic materials do not generally exhibit as high a conductivity as other non-magnetic lead materials such as those mentioned above, the ability to construct very thick leads, as discussed above, allows the use of such magnetic materials while still maintaining high conductivity. The side shielding provided by such magnetic leads 308, 310 provides improved signal resolution, preventing the reading of signals from adjacent tracks of data. Therefore, such side shielding provides a great advantage in the ability to read signals at very small track widths and very tight track spacing. As mentioned above, such side shielding would not be possible in a head having hard bias extending from the sides of the sensor and having relatively thin leads formed over the hard bias material. The magnetized hard magnetic material of such traditional hard bias layers would not function as a magnetic shield, and the leads, being relatively thin, would not be able to be constructed of a magnetic shielding material.

Figure 4:
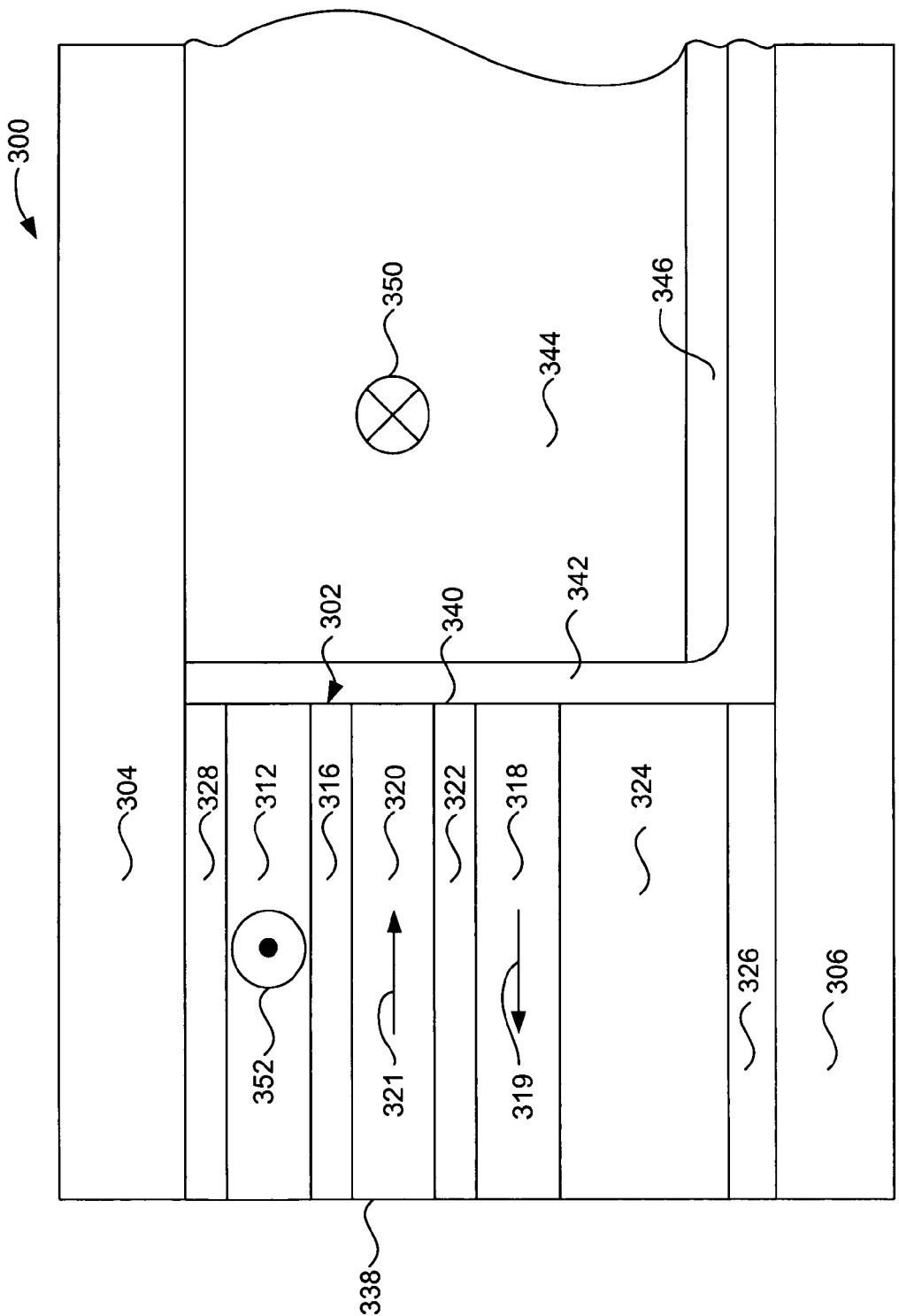
FIG. 4 is a side cross sectional view, taken from line 4-4 of FIG. 3.

With reference now to FIG. 4, which illustrates a cross sectional view of the sensor 300 viewed perpendicular to the ABS, the sensor stack 302 has a front ABS edge 338 and a back edge 340 at the back of the stripe height opposite the ABS edge 338. An insulation layer 342 covers the back edge 340 of the sensor stack 302, and may extend over the first gap layer 306. This insulation layer 342, preferably $Al_2O_3$, can be deposited in a single conformal deposition after the back edge of the sensor stack has been defined by an ion milling or other material removal process that will be described in greater detail herein below.

With continued reference to FIG. 4, a hard bias layer 344, which can be constructed of CoPtCr or some other suitable high coercivity hard magnetic material extends from the back of the sensor stack 302. The hard bias layer 344 is separated from the sensor stack 302 by the insulation layer 342 in order to prevent shunting of sense current through the hard bias layer 344. The hard bias layer can extend a significant distance backward, away from the ABS in the stripe height direction. A seed layer 346 may be provided at the bottom of the hard bias layer 344. The seed layer 346 is preferably an electrically conductive material that can be sputter deposited, providing an electrically conductive substrate on which to sputter deposit the hard bias layer 344. The seed layer 346 is also preferably a material that has a desired crystalline structure in order to promote a desired crystalline structure in the hard bias layer 344. The crystalline structure of the hard bias layer 344 greatly affects its magnetic properties and therefore affects its performance as a hard bias layer.

Because the hard bias layer 344 has a high coercivity, it has the property that its magnetic moment maintains its orientation once it has been magnetized. Therefore, by applying a high magnetic field, the magnetic moment 350 of the hard bias layer 344 can be set as shown in a desired direction parallel with the ABS surface 338. Flux closure between the hard bias layer 344 and the free layer 312 at the sides of the sensor stack will cause the free layer 312 to have a magnetic moment 352 that is biased in direction parallel with the ABS as desired and antiparallel with the moment 350 of the hard bias layer 344.

Figure 5:
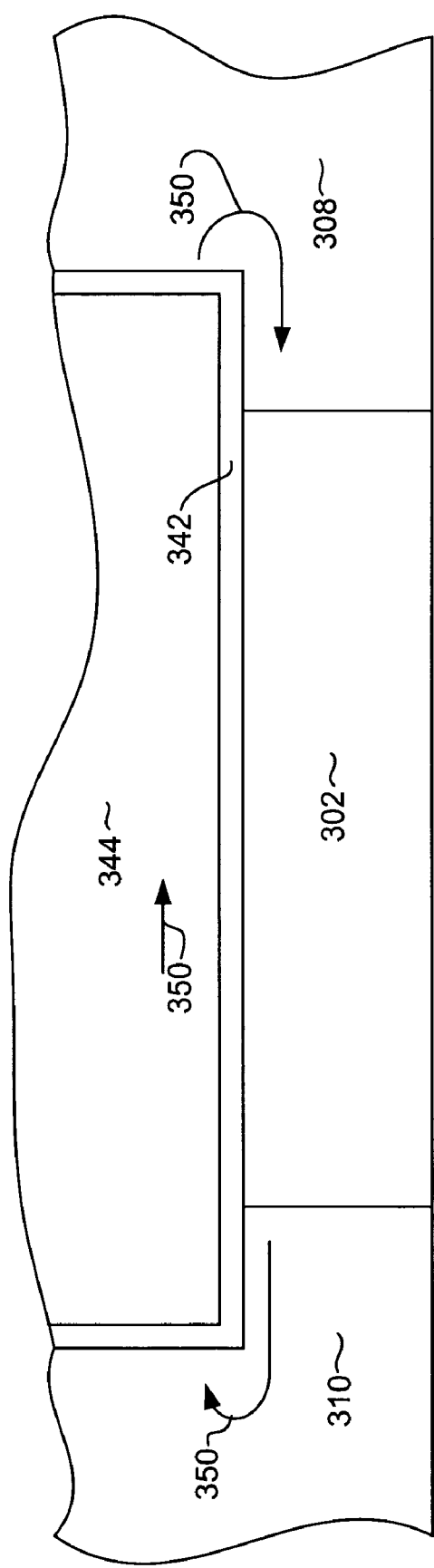
FIG. 5 is a plan view of a sensor according to an embodiment of the invention.

With reference now to FIG. 5A a top or plan view of the sensor 300 shows the sensor stack 302 and the leads 308, 310 extending from the sides of the sensor stack 302. Also as can be seen, the hard bias layer 344, and insulation layer 342 extend beyond the trackwidth defining sides 330, 332 of the sensor stack. The bias layer 344 provides a magnetic bias field 350 that biases the magnetic moment of the free layer (not shown in FIG. 5). Flux closure of the magnetic bias field 350 at the sides of the sensor stack at the back edge of the sensor stack provides the desired magnetic biasing in a direction parallel with the ABS. Extending the bias layer 344 slightly beyond the sides 330, 332 of the sensor stack 302 ensures that flux closure will properly bias the free layer with a magnetic bias field that is parallel with the ABS. If the hard bias layer were constructed to extend only to the sides 330, 332 of the sensor stack, or even worse, were to terminate short of the sides 330, 332 (within the track width region), then the flux closure of the bias field 350 would cause the bias field 350 to have a large component in an undesirable direction perpendicular to the ABS at the point where it reaches the sensor stack 302. Conversely, by extending the hard bias layer 344 beyond the sides 330, 332 of the sensor, the flux closure of the bias field 350 with the sensor stack 302, causes the bias field 350 to be essentially parallel with the ABS at the point where it reaches the sensor stack 302 (and the free layer 312). Another advantage to having the bias layer 344 extend beyond the sides 330, 332 of the sensor is that this leaves room for photolithographic misalignment and other manufacturing tolerances. If the alignment of the bias layer defining photo step (described in greater detail below) is slightly misaligned, the bias layer will still extend across the entire back edge of the sensor stack 302.

Providing free layer biasing at the back edge of the sensor provides several advantages over the prior art hard biasing at the sides of the sensor. First, the bias layer 344 provides uniform biasing across the track width of the sensor, whereas prior art free layers were biased more strongly at the outer edges (at the edges of the track width) than at the center of the sensor. Another advantage is that biasing the free layer provides improved GMR response. A magnetic signal from a magnetic medium will be able to affect the magnetic moment of the free layer much more readily near the ABS surface 338 than at the back edge 340 of the sensor because the front edge 338 of the sensor is closer to the medium. Since the free layer 312 is biased at the back edge 340, the front edge will be more responsive (ie. less magnetically stiff) than the back edge. Modeling has shown that this biasing arrangement provides significant signal response improvement. Another important advantage of placing the hard bias layer 344 at the back edge 340 of the sensor rather than at the sides 330, 332 is that is allows for the leads 308, 310 to be constructed as magnetic shields as described above. This is an important advantage, because in order to meet the needs of future high track density magnetic recording systems such side shielding will be critical to avoiding adjacent track interference.

Figure 6A:
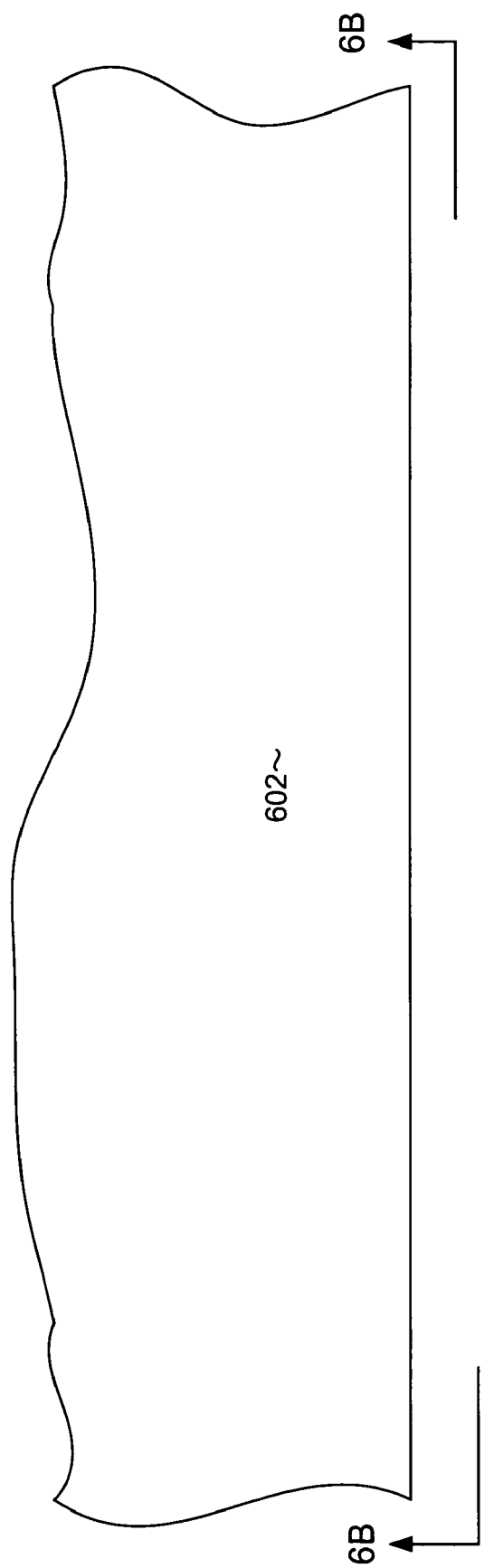
FIG. 6A is a plan view of a sensor according to an embodiment of the invention in an intermediate stage of manufacture.
Figure 6B:
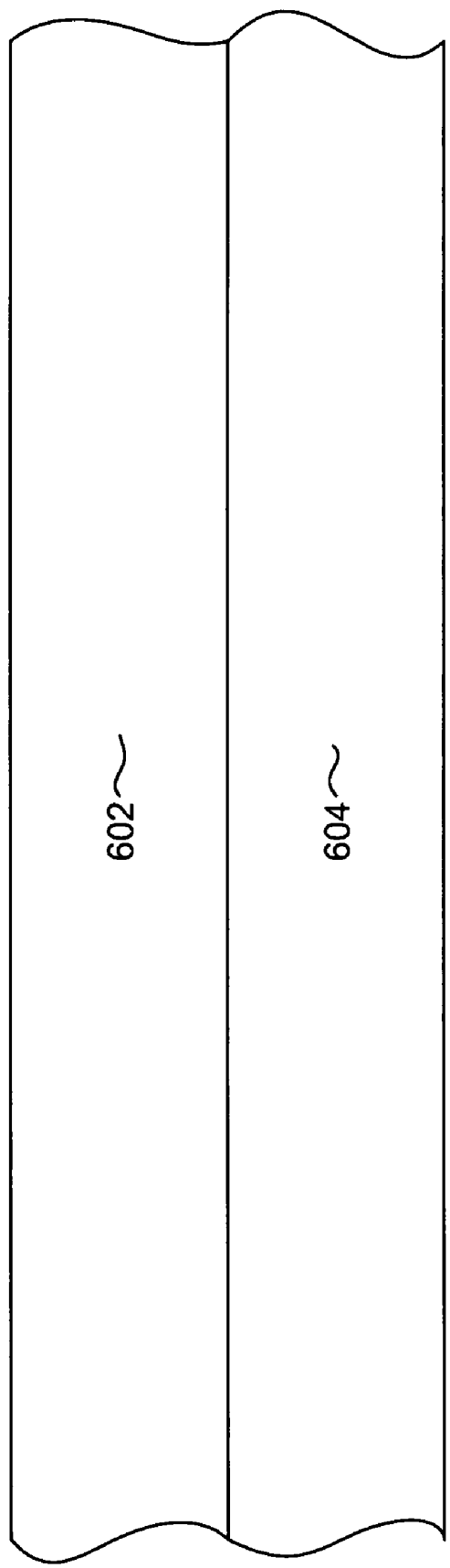
FIG. 6B is an ABS view taken from line 6B-6B of FIG. 6A.

With reference now to FIGS. 6A through 9B, a method of constructing a sensor according to an embodiment of the invention is described. With particular reference to FIGS. 6A and 6B full film sensor stack layers 602 are deposited over a substrate 604, which can be the first gap layer 306. The sensor layers 602 are shown as a single layer for purposes of simplicity, but would of course include the various layers making up the sensor stack 302 as shown in FIG. 3.

Figure 7A:
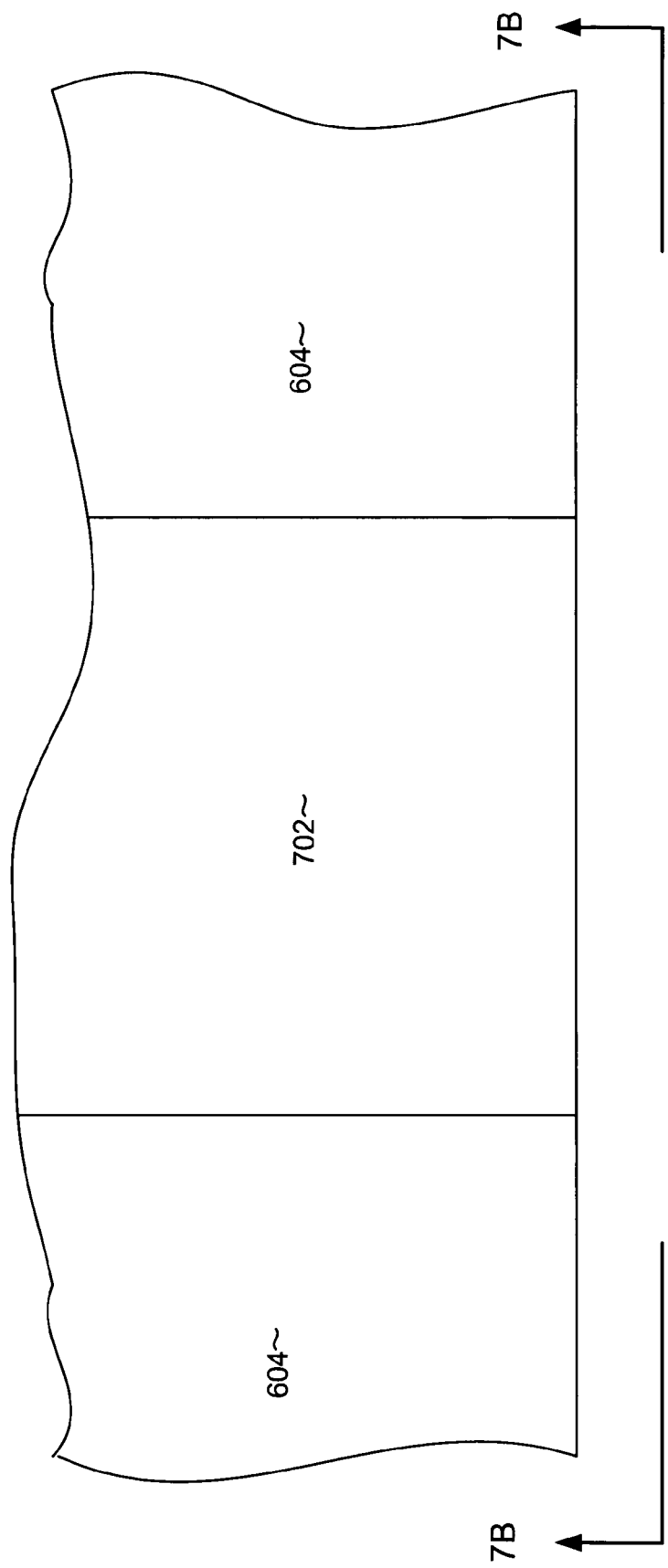
FIG. 7A is a plan view of a sensor according to an embodiment of the invention in an intermediate stage of manufacture.
Figure 7B:
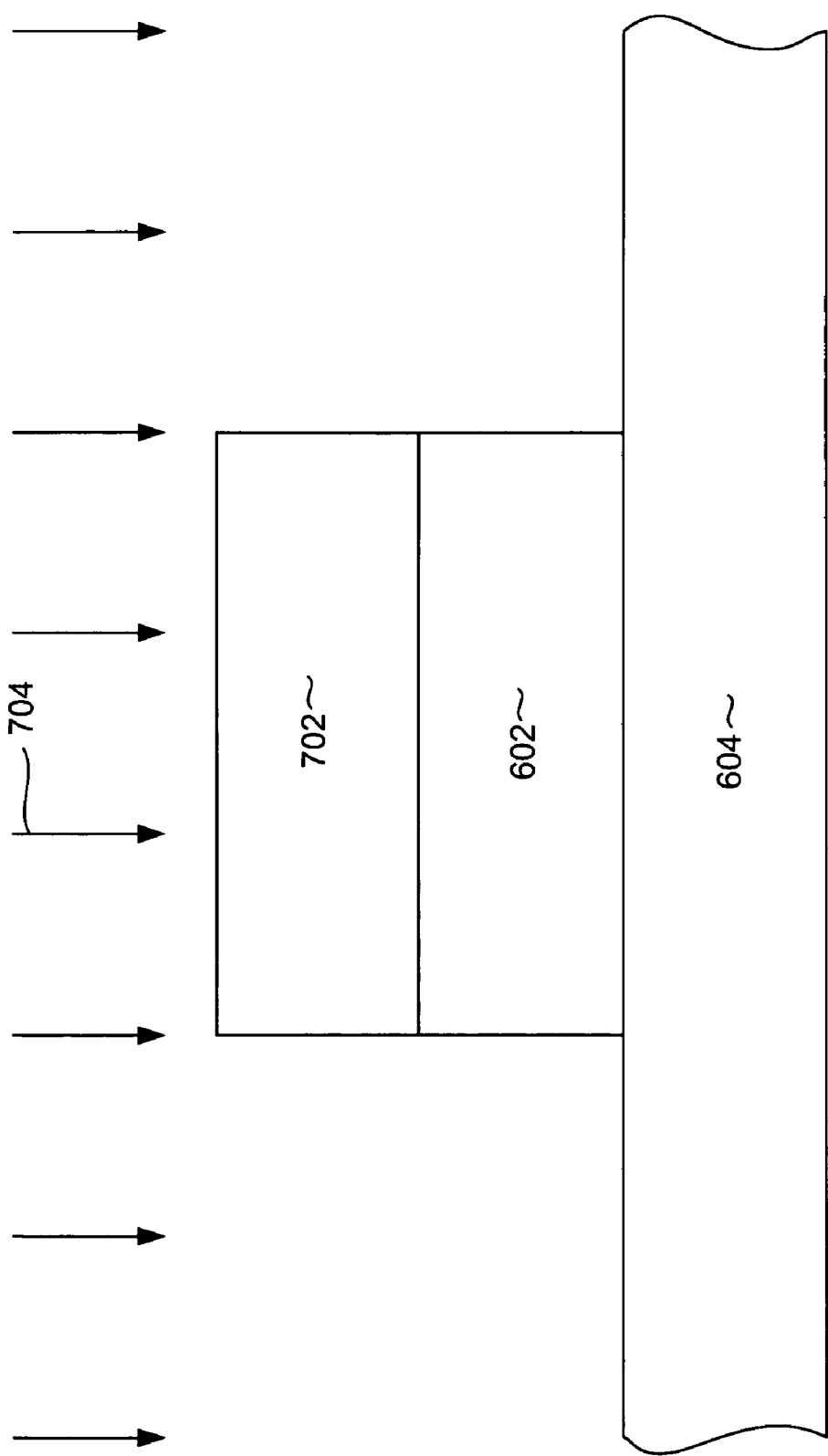
FIG. 7B is an ABS view taken from line 7B-7B of FIG. 7A.
Figure 7C:
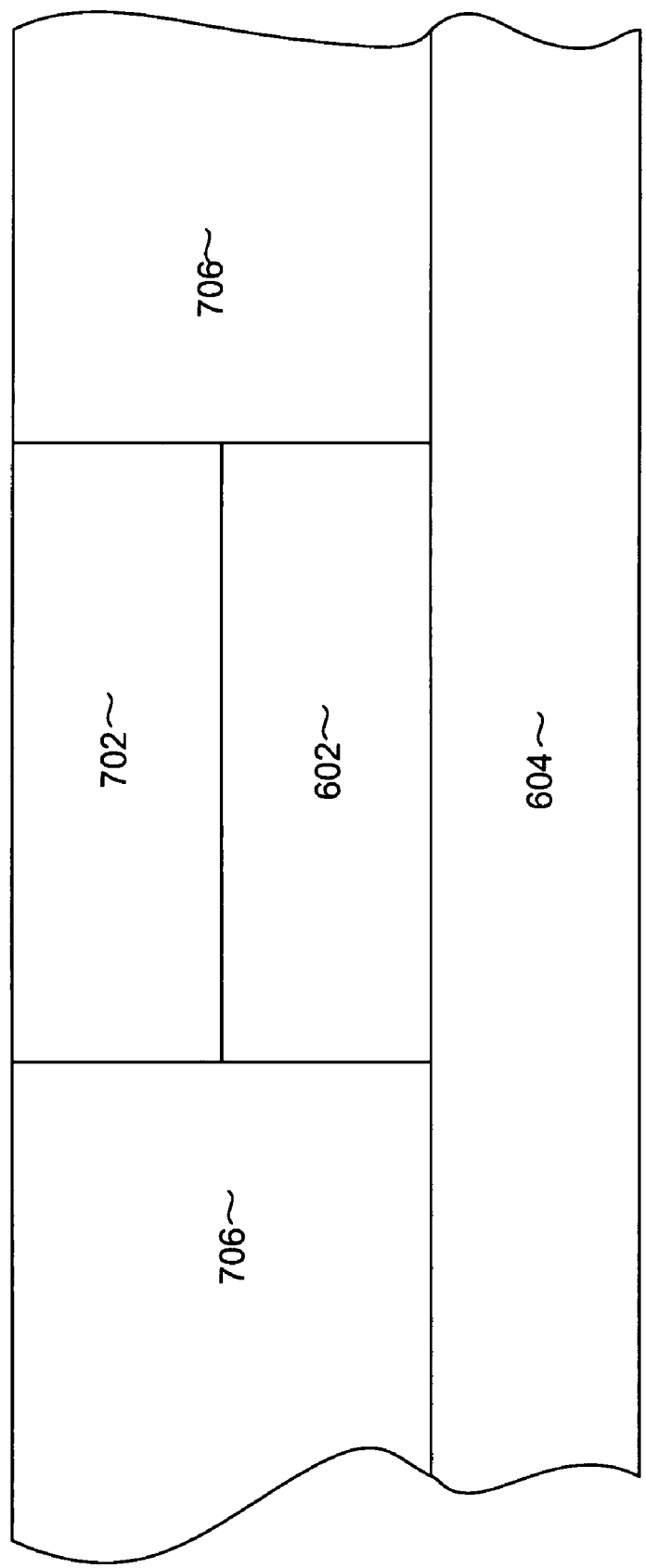
FIG. 7C is an ABS view similar to FIG. 7C showing a later, intermediate stage of manufacture.

With reference to FIGS. 7A and 7B, a mask 702 is formed over the sensor layers 602. The mask 702 can be of various forms and may include multiple layers, such as a layer of photoresist patterned over an antireflective coating. With the mask 702 formed, an ion mill 704 is performed to remove portions of the sensor material 602 that are not covered by the mask 702, thereby defining the sides 330, 332 of the sensor stack 302 (FIG. 3). With reference to FIG. 7C, an electrically conductive material 706 can then be deposited to form the leads 308, 310. The masking and milling process described above (that which defines the sides of the sensor stack) is often referred to in the industry as "K5".

Figure 8:
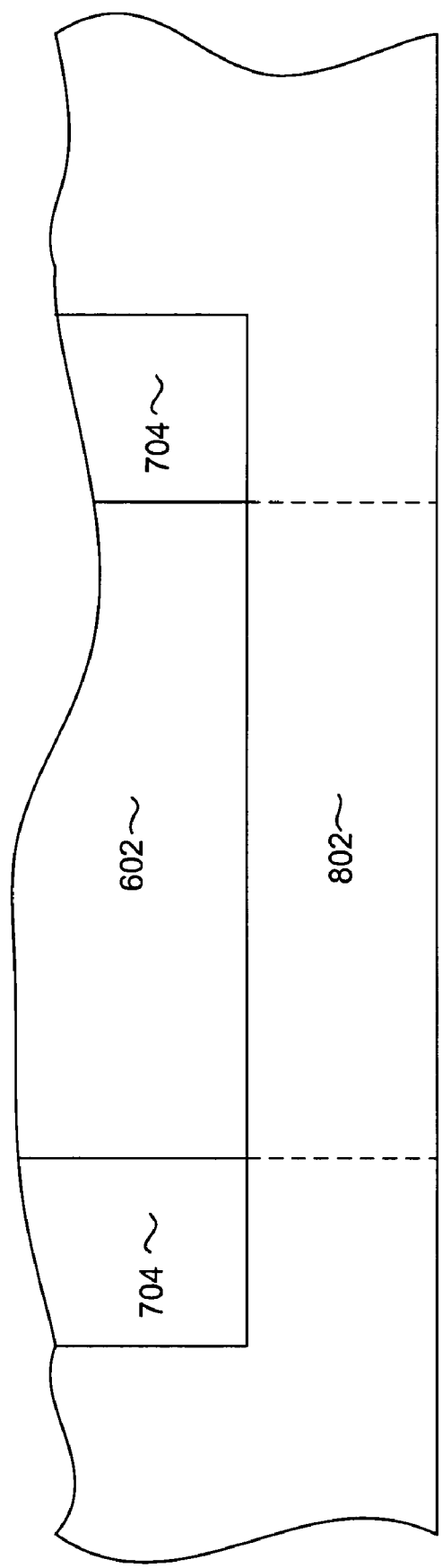
FIG. 8 is a plan view of a sensor according to an embodiment of the invention in an intermediate stage of manufacture.

With reference now to FIG. 8, a second mask 802 is formed over the previously deposited layers. This mask (often referred to as the K3 mask) defines the back edge or "stripe height of the sensor. The sides of the portions of the sensor materit 602 disposed beneath the mask 802 are show in dashes lines in FIGS. 8 and 9, although they would actually be hidden from view by the presence of the mask 802. As can he seen, the mask has an opening that defines the back edge (stripe height) of the sensor, but the opening also extends beyond the sides of the remaining sensor material 6O2. An ion mill (not shown) is then performed to remove material exposed by the opening in the mask 802.

Figure 9A:
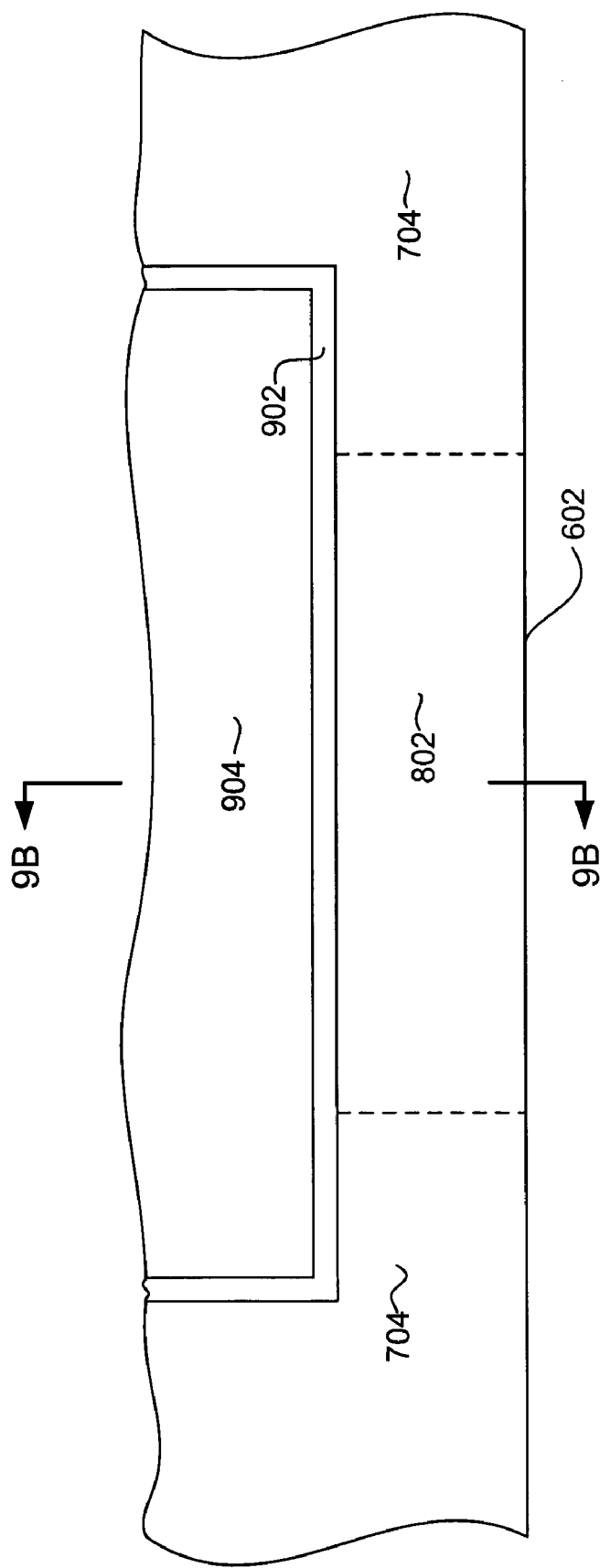
FIG. 9A is a plan view of a sensor according to an embodiment of the invention in an intermediate stage of manufacture.
Figure 9B:
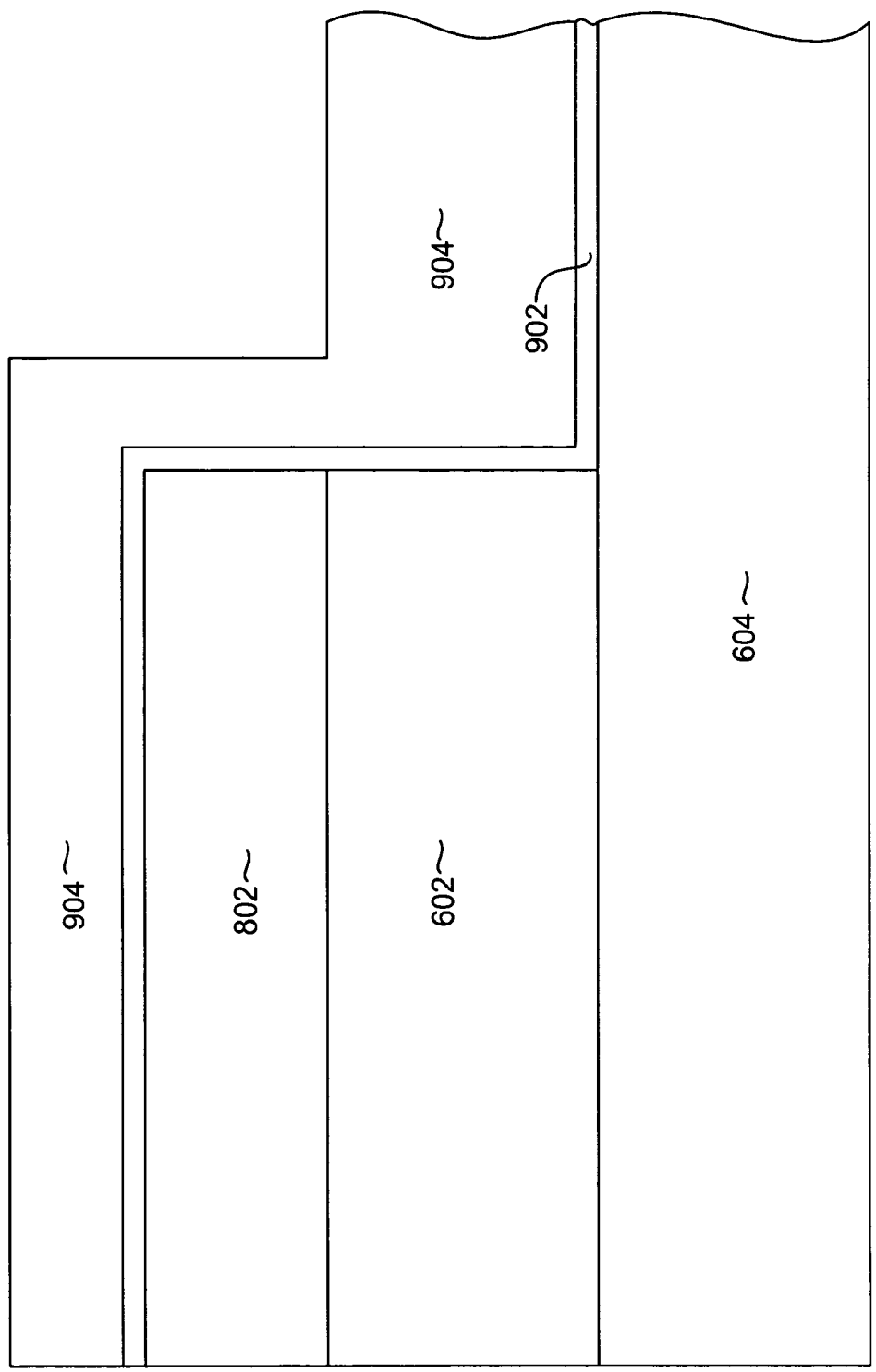
FIG. 9B is a side cross sectional view taken from line 9B-9B of FIG. 9A.

With reference to FIGS. 9A and 9B, a thin layer of non-magnetic, electrically insulating material 902 is deposited. The insulation material 902 is constructed of a material that can be conformally deposited. Such a material can be for example, alumina ($Al_2O_3$), which can be deposited by atomic layer deposition. Other deposition methods may be used as well. After the insulation layer has been deposited, a layer of magnetically hard (high coercivity) material 904 is deposited. Such a material may be for example CoPtCr. A seed layer capable of being sputter deposited may be initially deposited followed by deposition such as by electroplating of the hard magnetic material. After depositing the insulation material 902 and the hard magnetic material 904 a planarization process such as chemical mechanical polishing (CMP) (not shown) can be performed to remove excess material 902, 904 vet the mask 802 and to remove the mask 802 itself.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A method for manufacturing a current in plane giant magnetoresistive sensor, comprising:

depositing a first non-magnetic electrically insulating gap layer;

depositing a plurality of sensor layers;

forming, a first mask, the first mask being configured to define a track width of the sensor;

performing a first material removal process to remove sensor material not covered by the first mask, thereby defining first and second laterally opposed sides of the sensor;

depositing a layer of electrically conductive lead material;

removing the first mask, the electrically conductive lead material remaining at the first and second sides of the sensor;

after removing the first mask, forming a second mask having an opening configured to define a back edge which defines a stripe height of the sensor, the opening having a lateral width greater than the track width of the sensor;

performing a second material removal process to remove sensor material exposed by the opening in the second mask, thereby defining the back edge of the sensor;

depositing a layer of non-magnetic electrically insulating material to form a hard bias insulation layer, the non-magnetic electrically insulating material extending over the back edge of the sensor but not over the first and second laterally opposed sides of the sensor;

depositing a hard magnetic bias layer over the non-magnetic electrically insulating material, the hard magnetic bias layer being adjacent to the back edge of the sensor and separated from the back edge of the sensor by the non-magnetic electrically insulating material, the hard magnetic bias layer not extending over the first and second laterally opposed sides of the sensor; and depositing a second non-magnetic electrically insulating gap layer.

2. The method as in claim 1 wherein the layer of non-magnetic electrically insulating material deposited to form the hard bias insulation layer comprises a conformally deposited material.

3. The method as in claim 1 wherein the layer of non-magnetic electrically insulating material deposited to form the hard bias insulation layer insulates the hard magnetic bias layer from the electrically conductive lead material, and insulates the hard magnetic bias layer from the sensor layers.

4. The method as in claim 1 wherein the layer of non-magnetic electrically insulating material deposited to form the hard bias insulation layer comprises alumina.

5. The method as in claim 1, further comprising, before depositing the hard magnetic bias material layer, depositing an electrically conductive seed layer.

6. The method as in claim 1, wherein the electrically conductive lead material extends from the first non-magnetic, electrically insulating gap layer to the second non-magnetic, electrically insulating gap layer.

7. The method as in claim 1 wherein the first and second material removal processes comprise ion milling.

\* \* \* \* \*